(12) United States Patent
Gaunekar et al.

(10) Patent No.: US 7,303,111 B2
(45) Date of Patent: Dec. 4, 2007

(54) LIGHTWEIGHT BONDHEAD ASSEMBLY

(75) Inventors: Ajit Gaunekar, Singapore (SG); Gary Peter Widdowson, Hong Kong (CN)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 11/250,270

(22) Filed: Oct. 14, 2005

(65) Prior Publication Data
US 2007/0084901 A1 Apr. 19, 2007

(51) Int. Cl.
*B23K 37/00* (2006.01)
(52) U.S. Cl. .................. 228/4.1; 228/4.5; 228/47.1
(58) Field of Classification Search ............. 228/1.1, 228/4.5, 180.5
See application file for complete search history.

(56) References Cited

U.S. PATENT DOCUMENTS

| | | | |
|---|---|---|---|
| 3,209,447 A * | 10/1965 | Jones | 228/110.1 |
| 6,163,970 A * | 12/2000 | Nelle et al. | 33/482 |
| 6,425,514 B1 * | 7/2002 | Ou et al. | 228/102 |
| 6,474,529 B2 * | 11/2002 | Yamaguchi et al. | 228/4.5 |
| 6,813,225 B2 * | 11/2004 | Widdowson et al. | 369/44.15 |
| 2003/0035349 A1 * | 2/2003 | Widdowson et al. | 369/44.14 |
| 2006/0077399 A1 * | 4/2006 | Gaunekar et al. | 356/604 |

* cited by examiner

*Primary Examiner*—Kiley Stoner
(74) *Attorney, Agent, or Firm*—Ostrolenk, Faber, Gerb & Soffen, LLP

(57) ABSTRACT

A bondhead assembly having a bond body for mounting a bonding tool, a support structure that is configured to be drivable for moving the bondhead assembly to different locations and flexural elements arranged substantially along at least one plane which couple the bond body to the support structure for flexibly supporting the bond body during movement with respect to the support structure. A motor is coupled to the support structure and it is operative to drive the bond body to move relative to the support structure along an axis extending substantially perpendicular to the at least one plane.

15 Claims, 3 Drawing Sheets

Downward stroke

LIGHTWEIGHT BONDHEAD ASSEMBLY

FIELD OF THE INVENTION

The invention relates to a bondhead assembly, such as a bondhead assembly used for holding a pick-and-place tool for a die bonding machine.

BACKGROUND AND PRIOR ART

During semiconductor packaging, semiconductor chips or dice are usually mounted onto a substrate or carrier for processing. The semiconductor dice may be placed directly onto the surfaces of substrates, or such as in stacked dice configurations, they may be placed onto other dice. After attachment of the semiconductor die to the substrate or another die, the device is usually encapsulated in a downstream process.

Die bonding machines are used for picking up these semiconductor dice (which are typically cut from a wafer), and thereafter placing them onto substrates, carriers or other dice. Such die bonding machines have bondhead assemblies to hold and position die pick or die bonding tools that are used in these pick-and-place processes.

Due to the introduction of semiconductor dice that are becoming increasingly smaller in size, the demands on die bonding machines are becoming more exacting. Amongst other considerations, smaller and/or thinner dice are more prone to cracking, and require greater care in handling. Present die bonding systems are slowly becoming less capable of meeting these demands.

FIG. 1 is a cross-sectional side view of a conventional bondhead 110 used for die bonders. It generally comprises a bond body 102 that is carried by a support structure 104. The bond body 102 is drivable to move along a vertical axis by the raising or lowering of the support structure 104, and is mounted to the support structure 104 via an adjustable spring post 106 that further has a preload spring 108 between the adjustable spring post 106 and the bond body 102. The preload spring 108 biases the bond body 102 towards the support structure 104 when the bondhead 100 is in a standby position. Further, relative movement between the bond body 102 and the support structure 104 is guided by a cage bearing 110 movable along a shaft 112.

The bond body 102 holds a pick-and-place tool 114, which is operative to pick dice from a pick-up position and then place the dice and/or bond them at a placement position. The pick-and-place tool 114 is commonly in the form of a collet assembly. A vacuum outlet 116 connected to the pick-and-place tool 114 is used where the dice are to be picked using vacuum suction. In FIG. 1, a die 118 held by the pick-and-place tool 114 is being placed onto a substrate 120. The die 118 may be attached to the substrate 120 using adhesive or other means. A contact sensor 122 at an end of the bond body 102 is in contact with a portion of the support structure 104 during standby. The contact sensor 122 is disengaged from contact with the support structure 104 when the pick-and-place tool 114 is prevented from further downward movement as the support structure 104 is traveling downwards. The disengagement of the contact sensor 122 indicates that contact of the pick-and-place tool 114 has been made with a relatively fixed surface, and therefore of the die 118 with the substrate 120. Further lowering of the support structure 104 imparts a bond force to the die 118 by way of the force exerted by the preload spring 108.

In this conventional bondhead design, contact with a die is sensed using the contact sensor 122. The total moving mass comprised in the aforementioned bondhead is about 17 grams. A disadvantage of such a large floating mass is that a relatively higher impact force is imparted onto the die 118 from the pick-and-place tool 114. This may lead both to a shortened life of the place-and place tool 114 as well as occasional die crack. If the search velocity during die placement onto the substrate 120 is decreased in order to reduce the impact force, the downside is that the throughput of the machine is reduced substantially. Consistent performance is further limited by stiction in the cage bearing 110, such that the frictional forces between the cage bearing 110 and shaft 112 cause the force required to initiate relative movement thereof to be inconsistent. Moreover, the use of a contact sensor 122 may such give to problems with the contact sensor itself, such as contamination and wear. There is a desire to develop a bondhead that is lighter and more reliable as compared to the aforementioned conventional bondhead 100.

SUMMARY OF THE INVENTION

It is therefore an object of the invention to seek to provide a bondhead that is more lightweight as compared to the prior art, and which seeks to avoid at least some of the above disadvantages of conventional bondheads.

Accordingly, the invention provides a bondhead assembly comprising: a bond body for mounting a bonding tool; a support structure that is configured to be drivable for moving the bondhead assembly to different locations; flexural elements arranged substantially along at least one plane which couple the bond body to the support structure for flexibly supporting the bond body during movement with respect to the support structure; and a motor coupled to the support structure that is operative to drive the bond body to move relative to the support structure along an axis extending substantially perpendicular to the at least one plane.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

An example of a preferred embodiment of a bondhead assembly in accordance with the invention will now be described with reference to the accompanying drawings, in which.

DETAILED DESCRIPTION OF THE PREFERRED EMBODIMENT OF THE INVENTION

Figure 1:
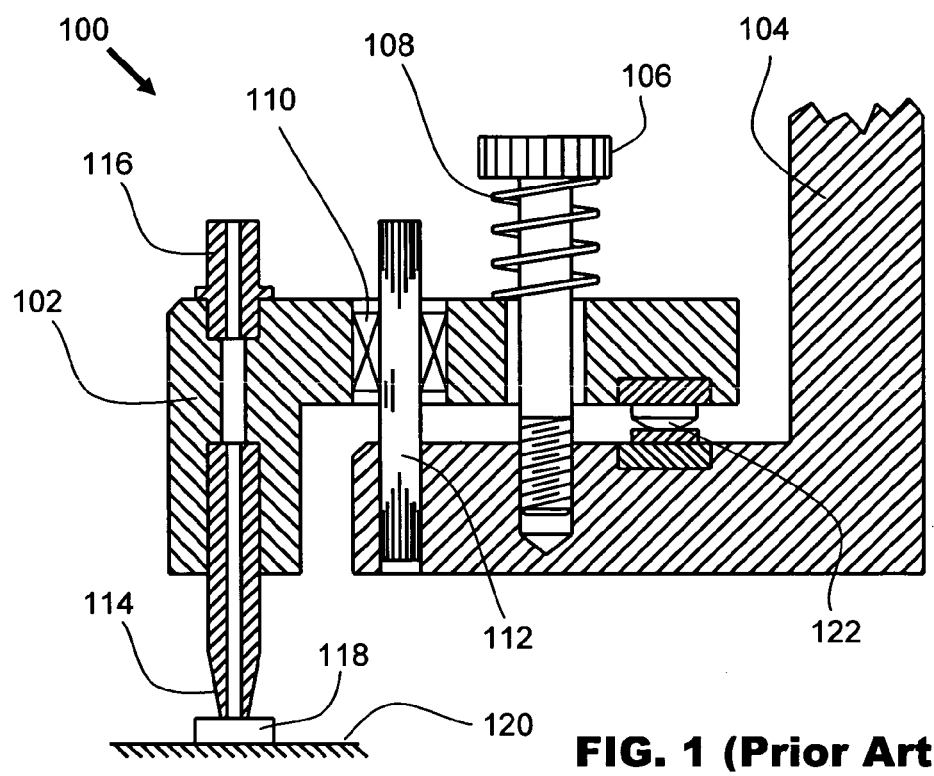
FIG. 1 is a cross-sectional side view of a conventional bondhead for a die bonder.
Figure 2:
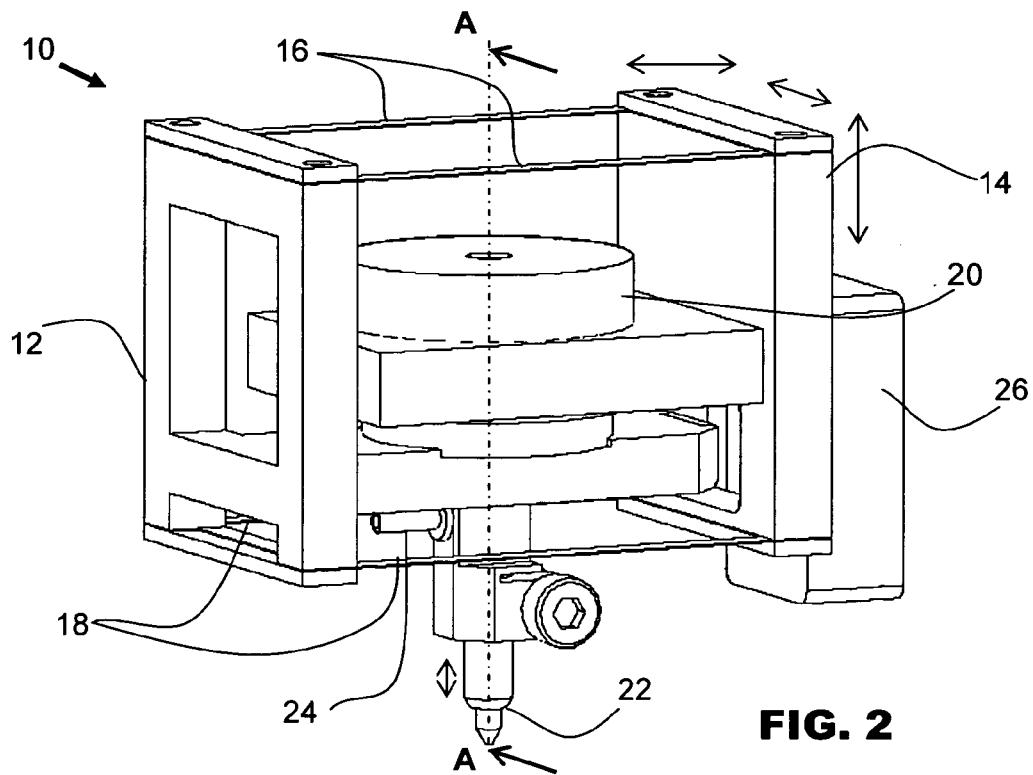
FIG. 2 is an isometric view of a bondhead assembly for a die bonder according to the preferred embodiment of the invention.

FIG. 2 is an isometric view of a bondhead assembly 10 for a die bonder according to the preferred embodiment of the invention. It comprises a bond body 12 that is coupled to a support structure 14 by way of flexural elements, such as two sets of flexures 16, 18 for flexibly supporting the bond body 12 during movement relative to the support structure 14. The flexures 16, 18 are preferably arranged along two planes, such that one flexure 16 is attached towards the top of the bond body 12 and the other flexure 18 is attached towards the bottom of the bond body 12. The first and second planes are arranged parallel to each other. Alternatively, one set of flexures may be used such that the flexures are arranged only along one plane, but this may result in lower lateral and rotational rigidity.

A bonding tool, which is in the form of a collet 22, is mounted on the bond body 12 and is configured to be movable with the bond body 12. The bonding tool may be a die pick-and-place tool or a die bonding tool. A motor, preferably a voice coil motor 20, configured to impart motion directly to the bond body 12 and collet 22 is mounted to the support structure 14. The bond body 12 is drivable by the voice coil motor 20 upwards and downwards along an axis extending substantially perpendicular to the planes on which the flexures 16, 18 are arranged, which in turn drives the collet 22 correspondingly. A vacuum outlet 24 is fluidly connected to the collet 22 to enable it to pick up semiconductor dice by way of vacuum suction. Additionally, an encoder 26 is advantageously mounted on the support structure in order to monitor movement of the bond body 12.

The support structure 14 is configured to be drivable by a motor (not shown) for moving the bondhead assembly 10 to different locations, such as between a die pick location and a die bond location. The support structure 14 will generally be driven to position the bondhead assembly 10 over the desired location, before the collet 22 is further driven by the voice coil motor 20 to pick up or to bond a die. As opposed to the bond body 12 and collet 22 that are configured to be drivable only upwards and downwards towards a surface, the support structure 14 is configured to be drivable in all the three axes of a Cartesian coordinate system to position the collet 22 over a desired location.

Figure 3:
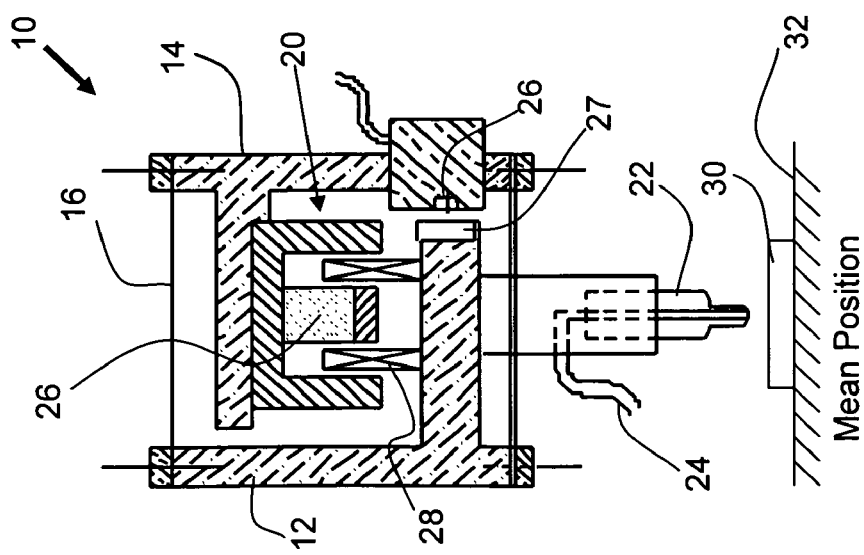
FIG. 3 is a cross-sectional side view of the bondhead assembly taken along line A-A of FIG. 2 at its mean or standby position.

FIG. 3 is a cross-sectional side view of the bondhead assembly 10 taken along line A-A of FIG. 2 at its mean or standby position. In this view, the voice coil motor 20 can be seen to comprise a magnetic circuit component such as a permanent magnet 26 mounted to the support structure 14 to form a magnetic circuit, and a voice coil component comprising a voice coil 28 mounted to the bond body 12. It would be appreciated that the permanent magnet 26 may instead be mounted on the bond body 12 and the voice coil 28 may in that case be mounted to the support structure 14. The voice coil 28 is adapted to be movable relative to the magnet 26 for driving the bond body 12 by way of electromagnetic interaction. In this standby position, the orientation of the flexures 16, 18 is relatively horizontal. For greater rigidity, the flexures 16, 18 are located on opposite sides of the voice coil motor 20.

The actuating force from the voice coil motor 20 is preferably arranged to lie in a plane that is orthogonal to the planes on which the flexures 16, 18 are arranged and passing through their mid-points. One would note that the collet 22 and voice coil motor 20, and therefore the actuating force, are positioned substantially centrally relative to the positions of the flexures 16, 18 and are substantially equidistant from each side of the flexures 16, 18. This promotes accuracy of movement by limiting flexing of the flexures 16, 18 in directions other than vertically. The collet 22 is preferably mounted so that the voice coil motor 20 is coaxial with the collet 22 such that the effective motor force passes directly through the collet 22.

Figure 4:
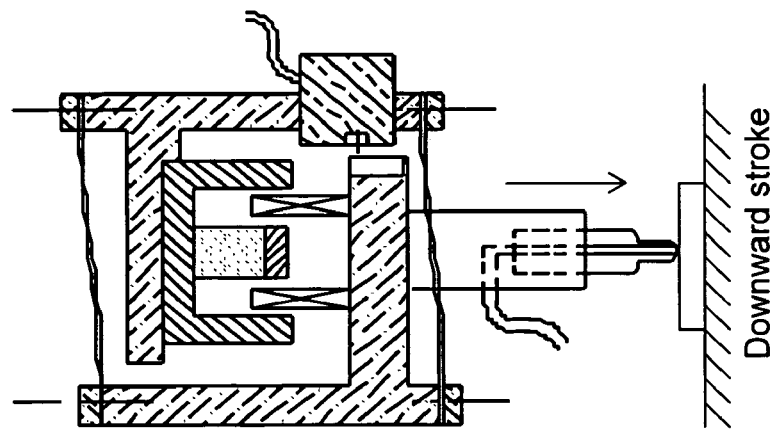
FIG. 4 is a cross-sectional side view of the bondhead assembly according to FIG. 3 during its downward stroke to pick up a die.

FIG. 4 is a cross-sectional side view of the bondhead assembly 10 according to FIG. 3 during its downward stroke to pick up a die 30. Current is made to flow through the voice coil 28 such that the voice coil 28 is made to move relative to the magnet 26 through electromagnetic interaction. In this case, the voice coil 28 moves in a direction away from the magnet 26, thereby projecting the collet 22 downwards towards the die 30 that is resting on a surface 32.

As the bond body 12 is correspondingly moved relative to the support structure 14, the motion of the bond body 12 flexes the flexures 16, 18 in the direction of the die 30. Preferably, the support structure 14 remains relatively stationary throughout this motion. The encoder 26 may also monitor the distance moved by the bond body 12 by referencing markings on a scale 27 that is coupled to the bond body 12. Monitoring movement of the bond body 12 promotes active driving of the collet 22. When the collet 22 is sufficiently close to or is touching the die 30, vacuum suction may be switched on through a vacuum outlet 24 to hold the die 30 with vacuum force.

Another advantage of using a voice coil motor 20 in this configuration is that contact between the collet 22 and die 30 during downward movement of the collet 22 is detectable by a sudden surge in the current carried by the voice coil 28 above a predetermined level. Initially, the current in the voice coil 28 only needs to be sufficient to overcome resistance in the flexures 16, 18. However, when the collet 22 contacts the die 30 resting on the relatively-fixed surface 32, a surge in the current will result from the collet 22 trying to overcome the reaction force from the surface 32. Accordingly, contact between the collet 22 and the die 30 is detectable without the use of a separate contact sensor of the prior art.

Figure 5:
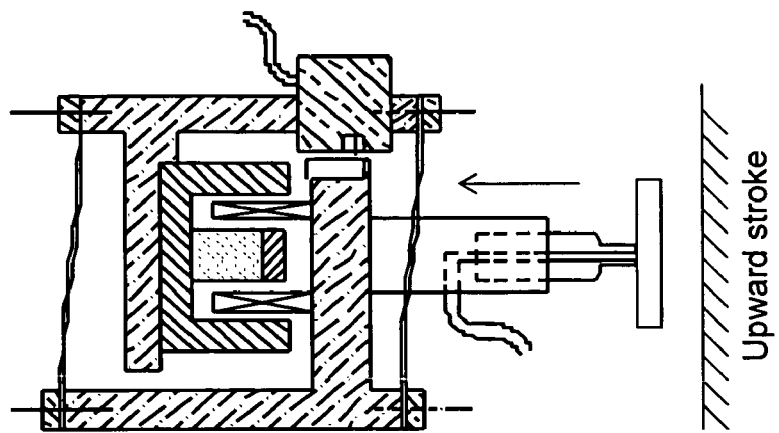
FIG. 5 is a cross-sectional side view of the bondhead assembly according to FIG. 3 during its upward stroke when a die has been picked up and is about to be moved to another location.

FIG. 5 is a cross-sectional side view of the bondhead assembly 10 according to FIG. 3 during its upward stroke when a die 30 has been picked up and is about to be moved to another location. To achieve this, current in the voice coil 28 is made to flow in an opposite direction to that used for lowering the collet 22 so that the voice coil 28 moves in a direction towards the magnet 26. This retracts the collet 22 upwards while holding the die 30 and this lifts the die off the surface 32.

As the bond body 12 is moved upwards, the flexures 16, 18 are also flexed upwards in a direction away from the surface 32. The bondhead assembly 10 may now be moved to a placement position whilst the collet 22 is holding onto the die 30 for placement of the die 30.

Figure 6:
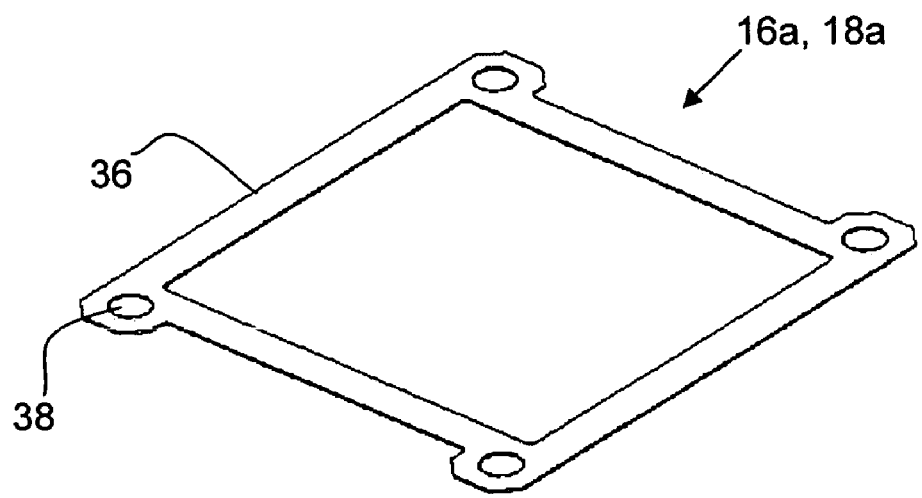
FIG. 6 is an isometric view of an example of a plain flexure that is suitable for incorporation into the bondhead assembly according to the preferred embodiment of the invention.

FIG. 6 is an isometric view of an example of a plain flexure 16a, 18a that is suitable for incorporation into the bondhead assembly 10 according to the preferred embodiment of the invention. The plain flexure 16a, 18a is formed of four flexible arms 36 arranged on the same plane and fixed in a generally rectangular or square shape. When mounted, two of the flexure arms 36 that extend between the bond body 12 and support structure 14 are seen as being spaced apart from each other. The flexure can be made of any suitable material, including stainless steel or beryllium copper. Mounting holes 38 are formed at each corner of the flexible arms 36 for mounting it to the bond body 12 or support structure 14 as appropriate.

Figure 7:
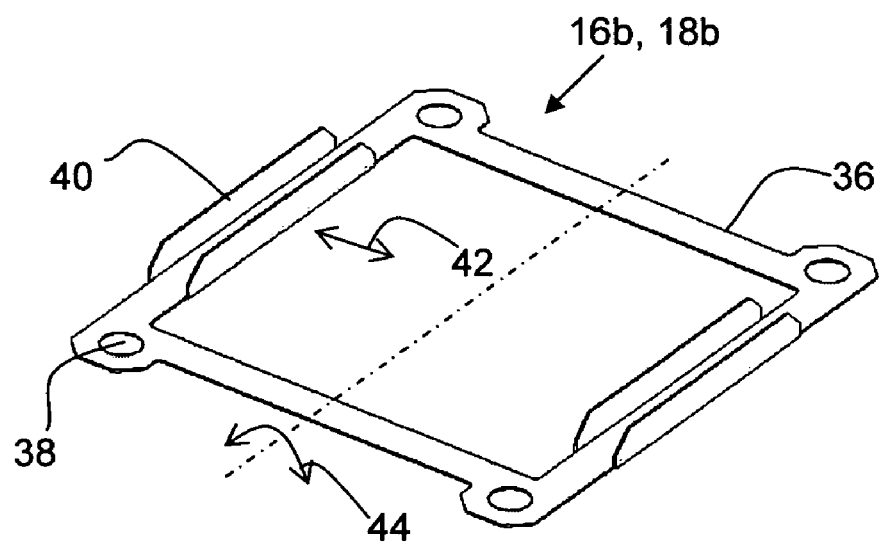
FIG. 7 is an isometric view of an example of a winged flexure that is suitable for incorporation into the bondhead assembly according to the preferred embodiment of the invention.

FIG. 7 is an isometric view of an example of a winged flexure 16b, 18b that is suitable for incorporation into the bondhead assembly 10 according to the preferred embodiment of the invention. The design is similar to that of the plain flexures 16a, 18a, but with the addition of winged flanges 40. These winged flanges 40 are preferably formed along at least two sides of the flexible arms 36 and extend outwards perpendicularly to the plane of the flexure 16b, 18b. They help to increase lateral and torsional rigidity in the winged flexure 16b, 18b against transverse motion 42 parallel to the plane of the flexure 16b, 18b as well as rotary motion 44 about an axis running parallel to the winged flanges 40. Movement of the winged flexure 16b, 18b can be concentrated essentially in directions parallel to the plane of the wings 40. Furthermore, the winged flanges 40 help to avoid buckling of the flexures 16b, 18b. Notwithstanding the foregoing, it should be appreciated that the above are just examples of flexures 16, 18 that may be beneficially used with the invention, but the descriptions are not meant to be exhaustive.

It would be appreciated that the use of flexure bearings in the preferred embodiment of the invention helps to reduce the weight of the bondhead assembly so that it is lighter. A weight of under 5 grams is achievable for such a bondhead assembly 10 as compared to up to 17 grams for the conventional bondhead 100. With a lighter bondhead assembly, impact on a die to be picked and placed is reduced without having to reduce machine throughput.

Moreover, since the actuating force of the voice coil motor 20 may be arranged to lie in a plane orthogonal to the planes of the flexures and passing through their mid-points, it helps to ensure symmetrical loading on the flexures 16, 18. The voice coil motor 20 is also co-axial with the bonding tool or collet 22 with the result that the motor force flows directly though the collet axis without having to relay this force through the flexures 16, 18. This approach helps to avoid a risk of failure by reason of buckling of the flexures 16, 18.

The invention described herein is susceptible to variations, modifications and/or additions other than those specifically described and it is to be understood that the invention includes all such variations, modifications and/or additions which fall within the spirit and scope of the above description.

The invention claimed is:

1. A bondhead assembly comprising:
   a bonding tool;
   a bond body mounting the bonding tool thereto;
   a support structure configured to be driven to move the bondhead assembly to different locations;
   flexural elements arranged substantially along at least one plane and attached to the bond body and the support structure, the flexural elements being operative to flexibly support the bond body during its movement with respect to the support structure; and
   a motor coupled to the support structure, the motor being operative to drive the bond body to move relative to the support structure along an axis extending substantially perpendicular to the at least one plane.

2. The bondhead assembly as claimed in claim 1, wherein the motor comprises a voice coil motor having a voice coil component and a magnetic circuit component configured for electromagnetic interaction, and wherein one component is mounted to the bond body and the other component is mounted to the support structure.

3. The bondhead assembly as claimed in claim 2, wherein the voice coil motor is configured such that contact of the bonding tool with a relatively fixed surface is detectable by a surge in the current carried by the voice coil component above a predetermined level.

4. The bondhead assembly as claimed in claim 1, wherein the motor is mounted centrally relative to the flexural elements such that the motor is configured to impart a force that lies in a plane that is orthogonal to the at least one plane of the flexural elements.

5. The bondhead assembly as claimed in claim 4, wherein the motor is further mounted such that the imparted force substantially passes through a mid-point of the at least one plane of the flexural elements.

6. The bondhead assembly as claimed in claim 1, wherein the bonding tool is mounted substantially coaxially with the motor such that an effective force from the motor passes directly through the bonding tool.

7. The bondhead assembly as claimed in claim 1, wherein the flexural elements comprise a first set of flexures arranged along a first plane and a second set of flexures arranged along a second plane parallel to the first plane.

8. The bondhead assembly as claimed in claim 7, wherein the first and second planes are located on opposite sides of the motor.

9. The bondhead assembly as claimed in claim 1, wherein the flexural elements comprise at least two flexible arms that are spaced apart from each other.

10. The bondhead assembly as claimed in claim 9, wherein the flexural elements comprise four flexible arms on the same plane arranged in a square or rectangular shape.

11. The bondhead assembly as claimed in claim 1, wherein the flexural elements further comprise flanges extending perpendicular to the at least one plane on which the flexural elements are arranged.

12. The bondhead assembly as claimed in claim 1, wherein the flexural elements are made of stainless steel or beryllium copper.

13. The bondhead assembly as claimed in claim 1, further comprising an encoder that is configured to monitor movement of the bond body with respect to the support structure.

14. The bondhead assembly as claimed in claim 13, including a scale with markings that is coupled to the bond body for referencing by the encoder to determine the distance moved by the bond body.

15. The bondhead assembly as claimed in claim 1, wherein the bonding tool is a die bonding device or a die pick-and-place device.

* * * * *